United States Patent
Betz et al.

(10) Patent No.: US 6,828,824 B2
(45) Date of Patent: *Dec. 7, 2004

(54) HETEROGENEOUS INTERCONNECTION ARCHITECTURE FOR PROGRAMMABLE LOGIC DEVICES

(75) Inventors: Vaughn Betz, Toronto (CA); Jonathan Rose, Toronto (CA)

(73) Assignee: Altera Toronto Co., Halifax (CA)

( * ) Notice: Subject to any disclaimer, the term of this patent is extended or adjusted under 35 U.S.C. 154(b) by 0 days.

This patent is subject to a terminal disclaimer.

(21) Appl. No.: 10/449,753

(22) Filed: May 30, 2003

(65) Prior Publication Data

US 2004/0017222 A1 Jan. 29, 2004

Related U.S. Application Data

(63) Continuation of application No. 09/478,097, filed on Oct. 12, 1999, now Pat. No. 6,590,419.

(51) Int. Cl.[7] ............................................. H03K 19/177
(52) U.S. Cl. ........................... 326/47; 326/41; 326/326; 326/101
(58) Field of Search .............................. 326/38–41, 101, 326/47; 257/499, 503; 333/12

(56) References Cited

U.S. PATENT DOCUMENTS

| | | |
|---|---|---|
| 4,870,302 A | 9/1989 | Freeman |
| 5,073,729 A | 12/1991 | Greene et al. |
| 5,268,598 A | 12/1993 | Pedersen et al. |
| 5,367,209 A | 11/1994 | Hauck et al. |
| 5,391,942 A | 2/1995 | El-Ayat et al. |
| 5,504,440 A | 4/1996 | Sasaki |
| 5,543,732 A | 8/1996 | McClintock et al. |
| 5,544,070 A | 8/1996 | Cox et al. |
| 5,648,913 A | 7/1997 | Bennett et al. |
| 5,687,325 A | 11/1997 | Chang |
| 5,796,267 A | 8/1998 | Pedersen |
| 5,801,546 A | 9/1998 | Pierce et al. |
| 5,825,202 A | 10/1998 | Tavana et al. |
| 5,880,598 A | 3/1999 | Duong et al. |
| 5,900,743 A | 5/1999 | McClintock et al. |
| 5,907,248 A | 5/1999 | Bauer et al. |
| 5,914,616 A | 6/1999 | Young et al. |
| 5,923,059 A | 7/1999 | Gheewala |
| 5,942,913 A | 8/1999 | Young et al. |
| 5,955,751 A | 9/1999 | Shroff et al. |
| 6,182,206 B1 | 1/2001 | Baxter |
| 6,239,615 B1 | 5/2001 | Ngai et al. |
| 6,407,576 B1 | 6/2002 | Ngai et al. |
| 6,476,635 B1 * | 11/2002 | Rahim et al. ............... 326/41 |
| 6,590,419 B1 * | 7/2003 | Betz et al. ............... 326/47 |

FOREIGN PATENT DOCUMENTS

WO    WO 00/52826    9/2000

* cited by examiner

*Primary Examiner*—Vibol Tan
(74) *Attorney, Agent, or Firm*—Fish & Neave; Garry J. Tuma

(57) ABSTRACT

An interconnection architecture for programmable logic devices (PLDs) is presented in which heterogeneous interconnect resources can be programmably connected to function blocks in accordance with two or more operational parameters, such as, for example, signal propagation speed, circuit area, signal routing flexibility, and PLD reliability. Programmable interconnect resources include unbalanced multiplexers, different types of interface buffers, and signal wires of different widths and different wire-to-wire spacings.

18 Claims, 10 Drawing Sheets

PRIOR ART   FIG. 1

HETEROGENEOUS INTERCONNECTION ARCHITECTURE FOR PROGRAMMABLE LOGIC DEVICES

CROSS REFERENCE TO RELATED APPLICATION

This is a continuation of U.S. patent application Ser. No. 09/478,097, filed Oct. 12, 1999, now U.S. Pat. No. 6,590,419, which is incorporated by reference herein in its entirety.

BACKGROUND OF THE INVENTION

This invention relates to programmable logic devices (PLDs) and more particularly to an improved interconnect architecture for such devices.

Programmable logic devices (PLDs) are a widely used form of integrated circuit due to the flexibility provided by their customizable nature. In general, PLDs include field programmable gate arrays (FPGAs), complex programmable logic devices (CPLDs), simple programmable logic devices, and laser programmable devices. Architecturally, a PLD includes logic blocks and input/output (I/O) blocks, which are connectable through a programmable interconnect structure or network.

A typical PLD is an integrated circuit chip that, wholly or in part, includes an array of one or more logic blocks, I/O, and a programmable routing or interconnect network that can be programmed by a user to provide an interconnection between the logic blocks and I/O circuits to achieve a desired logic function. The PLD can be a standalone device or can be embedded in a larger integrated circuit such as ASICs or the like. Exemplary forms of such devices are disclosed in U.S. Pat. Nos. 5,825,202 and 5,687,325.

The logic blocks may include a fixed logic function or may have programmable interconnections or functionality. The logic blocks may be further broken down as sub-blocks or grouped together as a cluster of blocks. The blocks may also include I/O circuits, which typically enable connection of the chip to external circuits or to other parts of the chip as in the case of embedded FPGAs. The I/O blocks are typically arranged at the periphery of a chip. A PLD is normally arranged as a regular array of logic blocks, each of which may be identical or may be of several different types such as RAM blocks, look-up-table based blocks, P-term based blocks, etc. The conductors of the programmable interconnect network array are typically arranged along rows and columns defined by the array of logic blocks as shown schematically in FIG. 1.

The interconnect structure of a PLD includes pre-fabricated wires and pre-fabricated switches which can be programmed to electrically connect different logic blocks to provide a desired function. The connections between the conductors (wires) and the logic blocks and between different wire segments is implemented by means of programmable switches at predetermined interconnection points. The programmable switches may be implemented as pass-transistors, tri-state buffers, fuses, antifuses, or combinations thereof. Laser programming of interconnections may also be achieved by burning off the metal conductors at desired locations. In some cases a switch state can be controlled by a static or dynamic random access memory (SRAM or DRAM), read only memory (ROM), electrically programmable read only memory (EPROM), electrically erasable and programmable read only memories (EEPROMs), flash memory or any other variation or combination of the above memory. Various types of switches are well known in the art and are described in, for example, U.S. Pat. Nos. 4,870,302 and 5,955,751, to list a few.

There are a number of tradeoffs involved in the design of PLDs. A PLD designer or architect is constrained by various operational parameters such as speed of circuits implemented in the PLD, semiconductor or silicon area required for a given logic capacity, power dissipation of the PLD once it has been programmed by a user, reliability (e.g., low glitch probability), and routing flexibility. A PLD architect cannot know before hand all the many uses for which a user may program the device. Thus PLDs are designed to be as general as possible.

For example, a PLD architect's objective may be to minimize the surface area of the PLD while maximizing the logic capacity. That is, maximize the number and functionality of logic blocks and provide sufficient interconnect resources and flexibility to allow as broad a range of circuit implementations as possible. Another design objective may be to maximize the speed of circuits implemented in the PLD while minimizing the surface area, logic, and interconnect resources required to implement the circuits. For example, a PLD architect knows that speed can be improved by reducing the number of programmable connection switches, but this comes at the expense of routing flexibility. Reliability in terms of glitch prevention can be improved by spacing interconnect wires further apart, but this comes at the expense of area.

Consequently, one area of focus in PLD architecture design is the interconnect network architecture, where the objective is to minimize the surface area required for the interconnect resources while maximizing the speed and minimizing the PLD resources required to implement circuits on the PLD. The interconnect architecture here refers to interconnect conductors, the programmable switches, and the interface between them and the logic blocks. U.S. Pat. No. 5,907,248 provides a background on various interconnection architectures and improvements thereto.

However, circuits implemented in PLDs tend to have different parts with different requirements. For example, some critical paths of the circuit have to be fast to meet timing requirements, some parts (e.g., clock signals) need to be glitch free, and parts not speed sensitive should use as little silicon area or PLD resources as possible.

Most PLD architectures do not take into account this circuit heterogeneity. Most of the prior art uses a homogenous interconnection architecture wherein parameters such as wire widths, spacing between wires, dimensions of the transistors used in the buffers and switches, interface circuits between the wires/switches, and the logic blocks are constant throughout the PLD. Furthermore, homogenous architectures are easier for CAD tools to map circuit descriptions into the PLD architecture.

Current interconnect architectures typically vary a single parameter in order to optimize the PLD. For example Actel's U.S. Pat. No. 5,073,729, Altera's U.S. Pat. No. 5,900,743, and Xilinx U.S. Pat. Nos. 5,801,546 and 5,907,248, describe PLD architectures in which optimization is limited to using different lengths of interconnect wires. For example, in U.S. Pat. No. 5,900,743, horizontal conductors of many different lengths make it possible to interconnect horizontally aligned logic regions using conductors that are close to the appropriate lengths. On the other hand, U.S. Pat. No. 5,942,913 describes an interconnect structure using a mixture of buffered and unbuffered interconnect lines. In both cases, optimization is limited to just one parameter. Thus, these architectures are limited in that they do not offer a user sufficient flexibility when designing a circuit that requires different PLD interconnect resources for different parts of the circuit.

Accordingly, there is a need for an improved PLD architecture that is optimized in terms of one or more selected operational parameters such as speed, power, area, flexibility and reliability, while minimizing the impact on the remaining parameters.

SUMMARY OF THE INVENTION

An advantage of the invention is the provision of a PLD architecture that is optimized for a selected one or more operational parameters, while minimizing the impact on the remaining parameters. For example the operational parameters may include speed, area, power, reliability and flexibility.

In accordance with this invention, a PLD includes one or more function blocks and a plurality of different groups of interconnect resources. Each group is programmably connectable to one or more of the function blocks, wherein a first number of one type of interconnect resource is optimized for a first operational parameter of the PLD and a second number of the same type of interconnect resource is optimized for a second operational parameter.

The function blocks may be logic blocks, input/output (I/O) circuits, or combinations of both.

In one embodiment of the invention, the interconnect resources include a plurality of interconnect conductors (e.g., wires) wherein a first number of conductors has a spacing between adjacent conductors that is less than the spacing between conductors of a second number of conductors. For example, respective portions of wires may be spaced at one unit and three units apart. The wires that are spaced further apart will have much lower coupling capacitances than the wires spaced closely together. The lower coupling capacitance reduces the signal delay through the wires, increasing the achievable speeds of circuits implemented in the PLD. The wires that are spaced closer together occupy less area, and are thus optimized for area.

In another embodiment, the interconnect resources include a plurality of interconnect conductors wherein a first number of conductors has conductor widths that are different than the conductor widths of a second number of conductors. The wires having larger widths have reduced resistance, which increases signal propagation speed, particularly over long wires. The wires with the narrower widths occupy less area.

In still another embodiment, the interconnect resources include a group of interconnect conductors (e.g., wires) wherein a first portion of the routing wires is connected by switches of a first size and a second portion of the wires is connected by switches of a second size. The switches with larger dimension have increased drive strength, which decreases the time required to charge and discharge the routing wire capacitance. The net result is increased speed. The smaller switches, although slower, occupy less area. In a preferred embodiment, the switch includes pass transistors. In an alternate embodiment, the switch includes tri-state buffers. A speed advantage can be achieved through larger transistors or by changing the number of stages (buffer sub-blocks) in the tri-state buffer.

In yet another embodiment, the interconnect resources include a plurality of multiplexers or tri-state buffer switches for coupling to the interconnect conductors (or wires) wherein a first number of the multiplexer or tri-state buffers has a different circuit topology than a second number of multiplexer or tri-state buffers. In a preferred embodiment, the multiplexer or tri-state buffer switches have a circuit topology that yields the highest speed for some switches, and a topology that is most area-efficient for other switches. For example, a 16:1 multiplexer can be implemented as sixteen independent pass transistors (a single-stage 16:1 multiplexer) or as a set of 2:1 multiplexers cascaded together in four stages. The single-stage 16:1 multiplexer has better speed, but requires a larger area.

In a further embodiment, the interconnect resources include a plurality of programmable switches for connecting the interconnect conductors (e.g., wires) to the logic block input or outputs or for connecting two different interconnect conductor segments. A first number of the wires has fewer routing switches connected to them (hence smaller capacitive load and thus faster), and a second number of the wires has a larger number of switches connected to them. Thus, by reducing the number of routing switches connected to some of the wires, the capacitive load on the wires is reduced. For example, some wires may have 20 programmable switches which can drive them, while others may have only 10. The wires driven by fewer switches will have higher speed, because they have less parasitic loading due to switches, and they require less switch area per wire. By reducing the number of switches that can be connected to only some of the routing wires, increased speed is achieved without reducing the overall flexibility of the PLD. It is also often possible to save area by reducing the number of switches connectable to only some of the wires.

In still a further embodiment, the interconnect resources include a plurality of routing wires with a first portion of the wires having extra-fast paths into function blocks and the second portion having more flexible routing. This may be implemented with multiplexers having an unbalanced tree topology coupled between routing wires and function (i.e., logic and/or I/O) block input pins.

In yet a further embodiment, the interconnect resources include two types of input pins at the interface between the function block input and the interconnect wires. One set of input pins is optimized for speed and the other for routing flexibility. By having the extra fast wires connect to special input pins on the function blocks, these input pins can be driven by a smaller number of routing wires, and thus have smaller (and faster) multiplexers between them and the routing wires. The second group of pins will be driven by a larger number of routing wires, thus allowing a larger number of wires to connect to the logic block and thus improving PLD flexibility.

In another embodiment, the interconnect resources include two different types of buffers at the interface between the function block output and the interconnect wires. Each output pin is connected to two groups of buffers. One group of buffers has lower intrinsic delay by virtue of having fewer stages and lower overall delay by virtue of having fewer interconnect wires that can be connected to it. The second group has more programmable switches loading it, thus it is slower, but has higher routing flexibility. The net effect is that speed-critical connections can use the faster, but less flexible, group of buffers, while the non-speed-critical connections can use the slower, more flexible group of buffers. As a result, the speed of a circuit implemented in the PLD is enhanced while routing flexibility is maintained.

In still another embodiment, the PLD includes a number of wires having either increased spacing between the wires or a grounded shield wire between them, or the wires use differential signaling, to reduce unwanted transitions or glitches on the wires. The other wires use a smaller spacing and no shield wires and thus are optimized for area.

In accordance with the invention, a given type of interconnect resource may be optimized for two or more operational parameters, and two or more different types of interconnect resources may each be optimized for two or more operational parameters.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
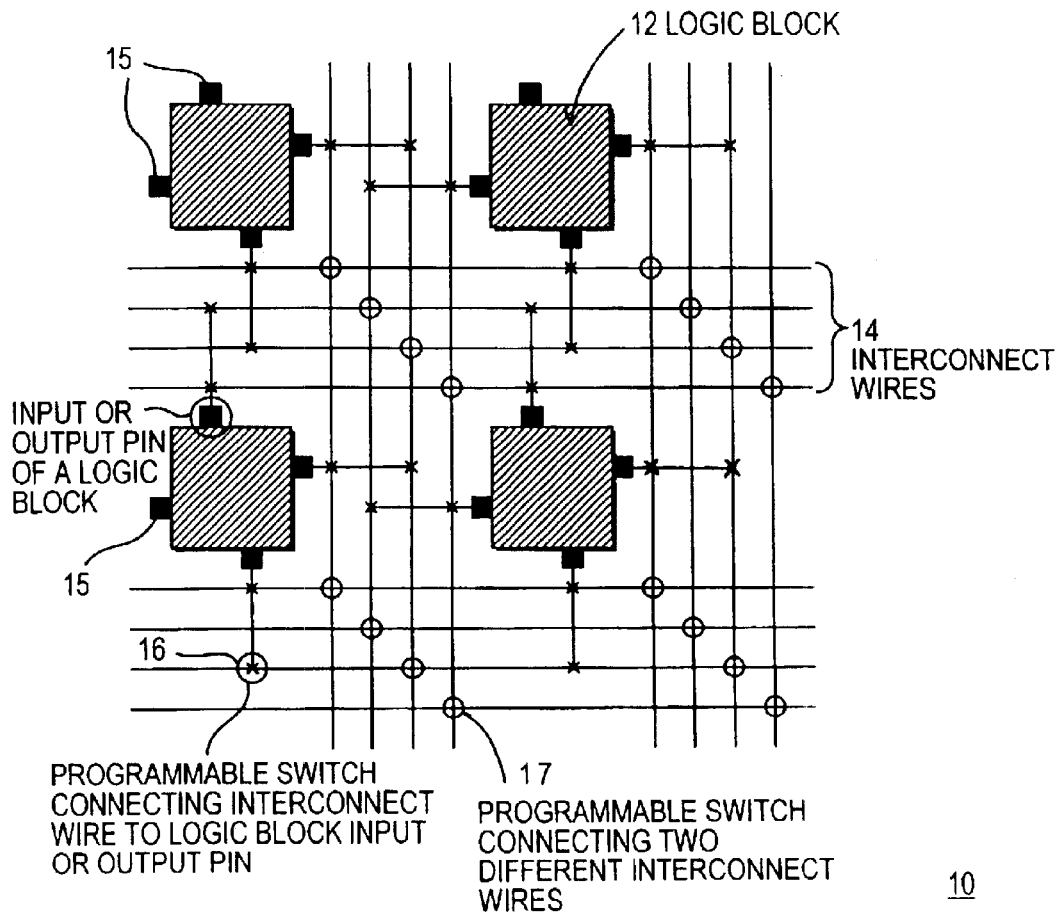
FIG. 1 is block diagram of a typical PLD architecture.

FIG. 1 is a block diagram of a typical PLD architecture. PLD 10 includes a number of logic blocks 12 arranged in a regular array with interconnect wires 14 arranged in vertical and horizontal channels between the logic blocks 12. Logic block 12 may perform one of many functions, the implementation of which is well known in the art. Typically, a logic block will have input or output pins 15. Programmable switches 16 are used for connecting the interconnect wires 14 to the logic block input or output pins. Programmable switches 17 are also located at intersections of the interconnect wires 14 for connecting two different interconnect wires together.

The invention is directed to the detailed design or architecture of an interconnect network in a PLD. This design or architecture should take into account a wide range of parameters that affect the electrical characteristics of the interconnect resources. These characteristics include the interface between the logic block and the interconnect wires; the width and spacing between interconnect wires; the type of programmable switch (pass-transistor or tri-state buffer) connecting interconnect wires to each other; the dimensions of transistors used to build the programmable switches; the distribution of programmable switches in the interconnect network; the distribution of the different lengths of interconnect wire segments in the PLD, and the fraction of wires 14 in an interconnect channel. The choice of each involves balancing complex trade-offs and interactions with other parameters. A more detailed explanation of these trade-offs are described in "Architecture and CAD for Deep-Submicron FPGAs" by Betz et al., Chapter 7, and are incorporated herein by reference.

Figure 2:
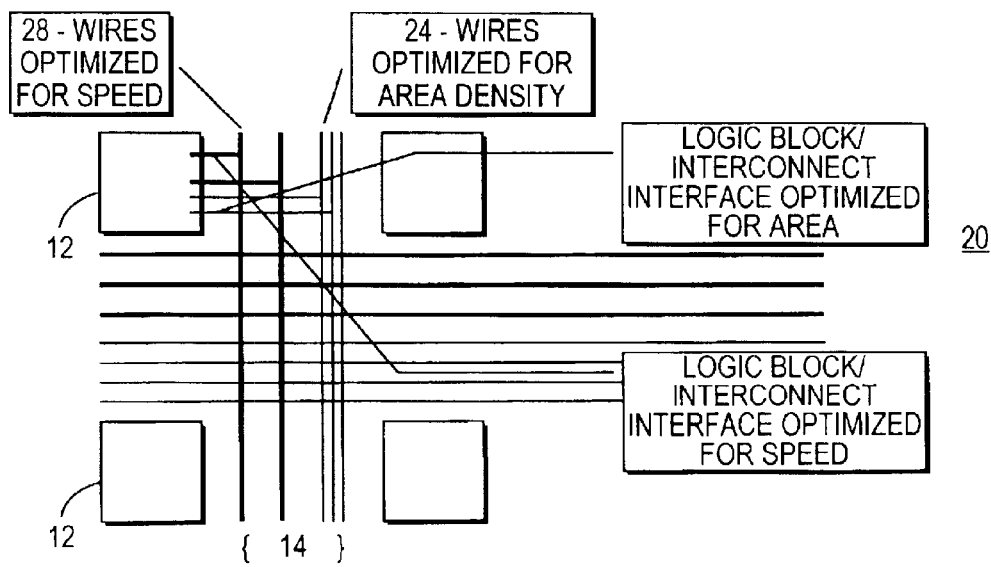
FIG. 2 is a block diagram of a PLD architecture according to the invention.

FIG. 2 shows a PLD architecture 20 according to an embodiment of the invention. Logic blocks 12 are arranged in a regular array, with the interconnect resources shown schematically as rows and columns forming a network around logic blocks 12. The interconnect resources include switches, wires, and logic block interconnect interfaces. As shown in FIG. 2, wires optimized for speed are indicated by a heavy black line, while wires optimized for area density are indicated by a lighter black line. The high speed wires are spaced further apart than the low speed wires. The wider spaced wires 28 represent a fraction of the total wires and are spaced in order to improve the speed at which they operate. The narrowly spaced wires 24 are spaced at a minimum distance to optimize the surface area of the PLD while still allowing the circuit to operate properly.

Figure 3:
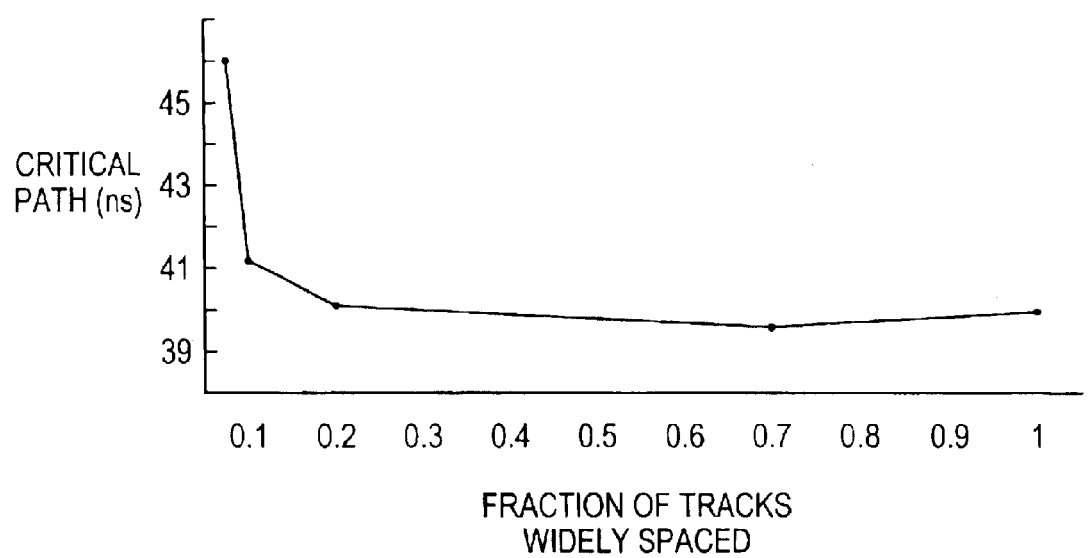
FIG. 3 is a graph illustrating the correlation between the speed of a circuit and fraction of widely spaced tracks used.

FIG. 3 shows the average speed achieved by a set of 20 benchmark circuits when implemented in a realistic PLD architecture. The vertical axis represents the critical path delay. The horizontal axis represents the fraction of routing tracks laid out with a wide metal spacing. In a preferred embodiment, this width is greater than the minimum spacing allowed in the PLD manufacturing process which, for example, may be about 2.5 $\mu$m. The remaining tracks are laid out with the minimum metal spacing required to allow the circuit to operate properly. In the preferred embodiment, the minimum width is equal to the minimum spacing allowed in the PLD manufacturing process which, for example, may be about 0.5 $\mu$m.

It is possible to ascertain from the graph that a PLD in which all the wires are widely spaced out is 15% faster than a PLD in which all of the wires are minimally spaced. However, if approximately 20% of the tracks are widely spaced out, it is still possible to obtain a 13% circuit speedup. Therefore, increasing the spacing of only 20% of the routing tracks minimizes the increase in metal area required, but still yields almost all of the achievable speedup.

Although it appears as if 20% is the optimal percentage to use for maximizing the speed of an FPGA while minimizing its area, it need not necessarily be exactly 20%. The exact percentage depends on the PLD manufacturing process and on the PLD architect. It may be that the PLD architect decides that the space required to widen 20% of the wires is too great a trade off for the resulting speedup and therefore widens a smaller percentage of wires. Conversely, the architect may decide that the increase in area is worth the trade off for obtaining even a faster speed, and therefore widens a greater percentage of the wires. The PLD also maintains its flexibility for implementing a wide variety of circuits.

In alternate embodiments, a similar result to that described in the preferred embodiment can be achieved. As previously mentioned, some of the factors influencing the speed of the circuit, in addition to the spacing between wires, are the wire width, the switch size, logic block size, circuit design of switches, the circuit design of the interface between the logic block and the interconnect, and the like. It is possible to improve the speed of the PLD with a minimal increase in area for all of these factors in a similar fashion as described above.

In one scenario for example, a portion of one of the interconnect resources is optimized for speed and the remainder of that resource is optimized for area. The rest of the interconnect resources are implemented at a constant width, or spacing (depending on the resource), that represents a compromise between speed and area. For example, it is possible to alter the size of a portion of the switches while maintaining equal wire widths and spacing between wires throughout the circuit. Then, as previously described, the PLD will achieve a maximum speed for a minimum area while maintaining its flexibility to be able to implement a wide variety of circuits. Further, since all of the components may not have the exact same effect on the circuit, the fraction of components that need to be optimized for speed may vary from component to component.

In a further embodiment, more than one component is optimized at a time. For example, it is possible to increase both a portion of the switch sizes and a portion of the wire widths for optimizing the area used to get a majority of the possible speedup. This embodiment is not limited to combining only two of the components. Rather, any number of components up to and including all possibilities may be optimized at one time.

Returning to FIG. 2, the interconnect resources include a plurality of interconnect conductors or wires wherein a first portion is selected to have spacing between adjacent conductors that is less than the spacing between conductors of the remaining portion. The wires spaced farther apart have much lower coupling capacitances than the wires spaced closely together. The lower coupling capacitance reduces the signal delay through the wires, increasing the achievable speeds of circuits implemented in the PLD. The cost is the increased metal area (decreased wiring density) caused by the larger metal pitch—this may increase the overall PLD area.

In still a further embodiment, the interconnect resources include a plurality of interconnect conductors or wires of the first and second type wherein the first type is selected to have conductor widths that are different than the conductor widths of the second type. The wires that have larger widths have reduced resistance, which leads to increased speed, particularly for long wires. The cost is the increased metal area (decreased wiring density) caused by the larger metal pitch—again this may increase the overall PLD area.

In yet a further embodiment, the interconnect resources include a plurality of interconnect conductors or wires coupled by switches of a first or second type. The switches of the first type are different in size than the switches of the second type. This increases the drive strength of these switches, which decreases the time required to charge and discharge wire capacitance. The net result is increased speed. The cost is the increase in active area necessitated by these larger switches, which, again, may increase the overall PLD area.

Figure 4A:
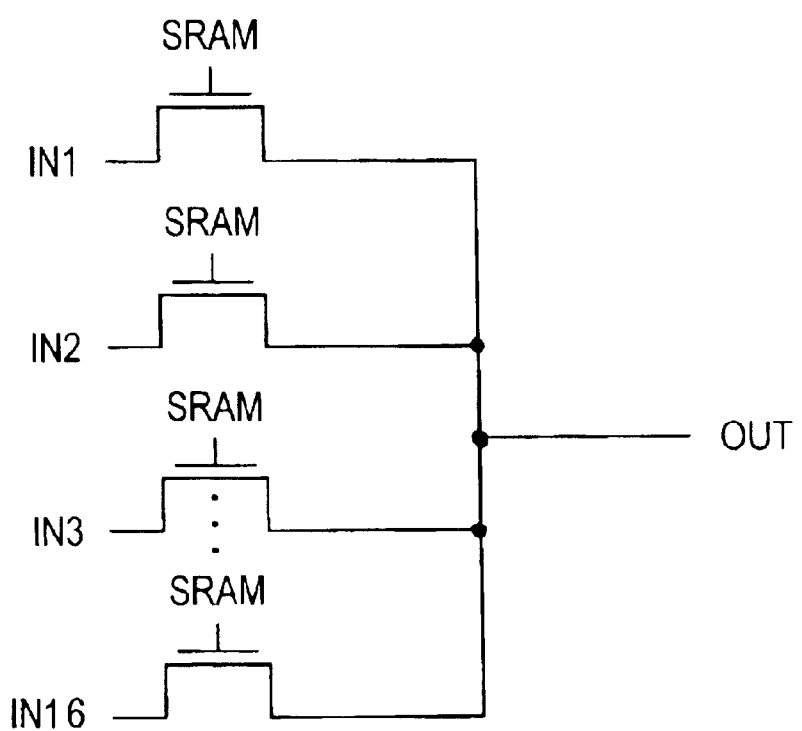
FIG. 4(a) is a schematic diagram of a high speed multiplexer.
Figure 4B:
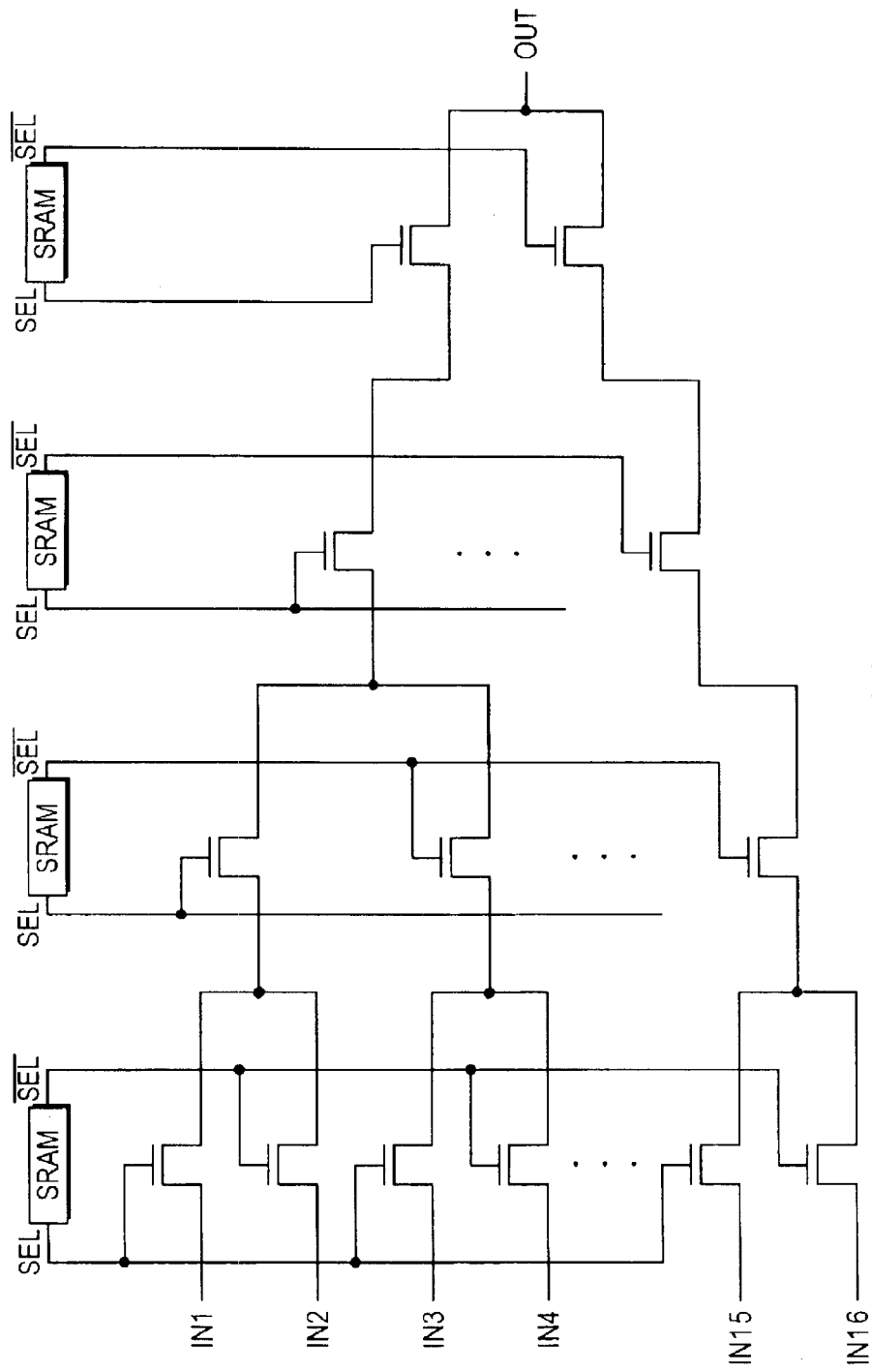
FIG. 4(b) is a schematic diagram of a low speed multiplexer.

In another embodiment as shown schematically in FIGS. 4(a) and (b), the interconnect resources include a plurality of multiplexers or tri-state buffer switches for coupling to the interconnect conductors or wires. The multiplexer or tri-state buffers of the first type have a different switch topology than the multiplexer or tri-state buffers of the second type. In a preferred embodiment, the multiplexer or tri-state buffer switches have a circuit topology that yields the highest speed for some switches, and a topology that is most area-efficient for other switches. For example, one could implement a 16:1 multiplexer as 16 independent pass transistors (a single-stage 16:1 multiplexer) or as a set of 2:1 multiplexers cascaded together in four stages. The single-stage 16:1 multiplexer has better speed, but requires a larger area.

Figure 5:
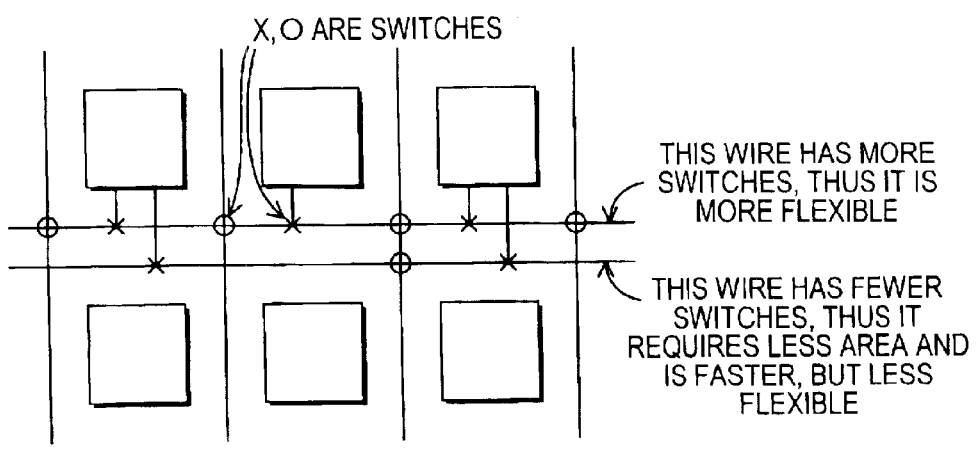
FIG. 5 is a schematic diagram of PLD architecture with different numbers of connect wires.

In still another embodiment, illustrated in FIG. 5, the interconnect resources include a plurality of routing switches for coupling to the interconnect conductors or wires. The switches are arranged in groups of the first or second type and which are each different in number. Thus by reducing the number of routing switches connecting to some of the routing wires, improved speed is gained. For example, some routing wires may have 20 routing switches which can drive them, while others may have only 10. The wires that are driven by fewer switches will have higher speed, because they have less parasitic loading caused by the switches, and they will require less switch area per wire. The cost is that the wires that connect to fewer switches have reduced routing flexibility—they cannot be joined in as many different configurations as routing wires that connect to a larger number of routing switches. If too many wires have reduced routing flexibility, the routability of the PLD may be significantly impacted—either many application circuits on this PLD will not route (i.e., will not work), or more routing wires will have to be added to the PLD to compensate for the reduced flexibility. Adding more routing wires to the PLD to compensate for the reduced flexibility increases PLD area. By reducing the number of switches that can connect to only some of the routing wires, a speed advantage on the more lightly loaded wires can be gained without overly reducing the flexibility of the PLD. Moreover, it is also often possible to gain an area savings by reducing the number of switches on only some of the wires in this manner.

Figure 6A:
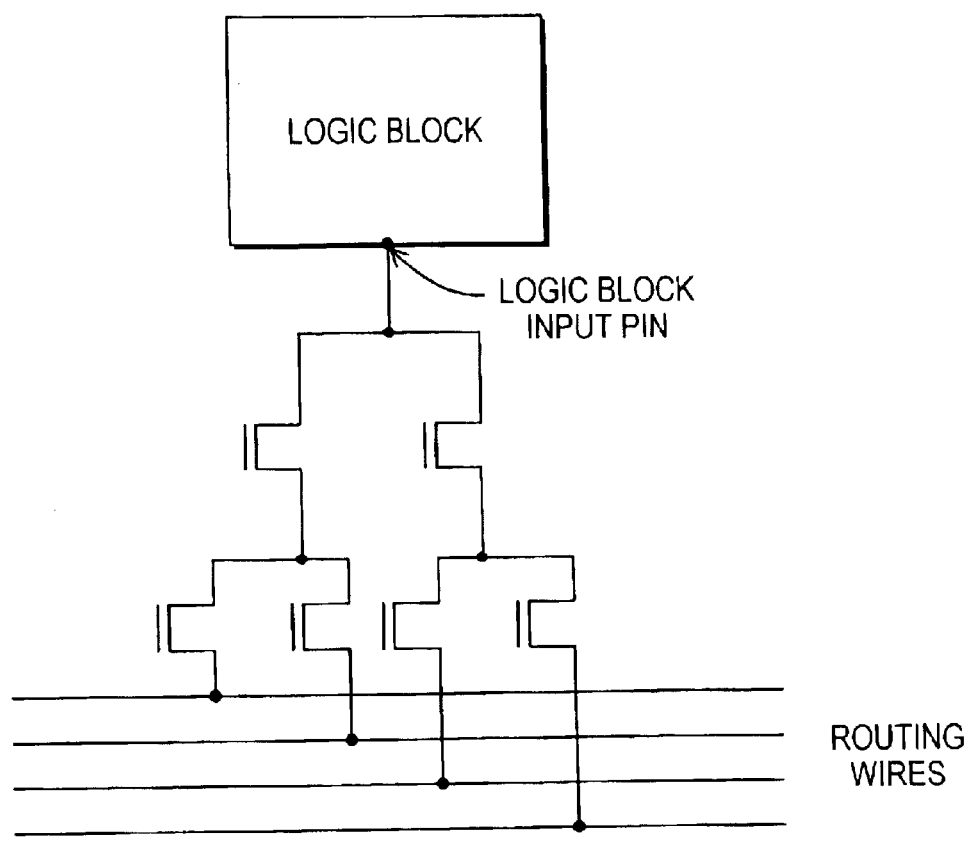
FIG. 6(a) is a schematic diagram of a balanced multiplexer.
Figure 6B:
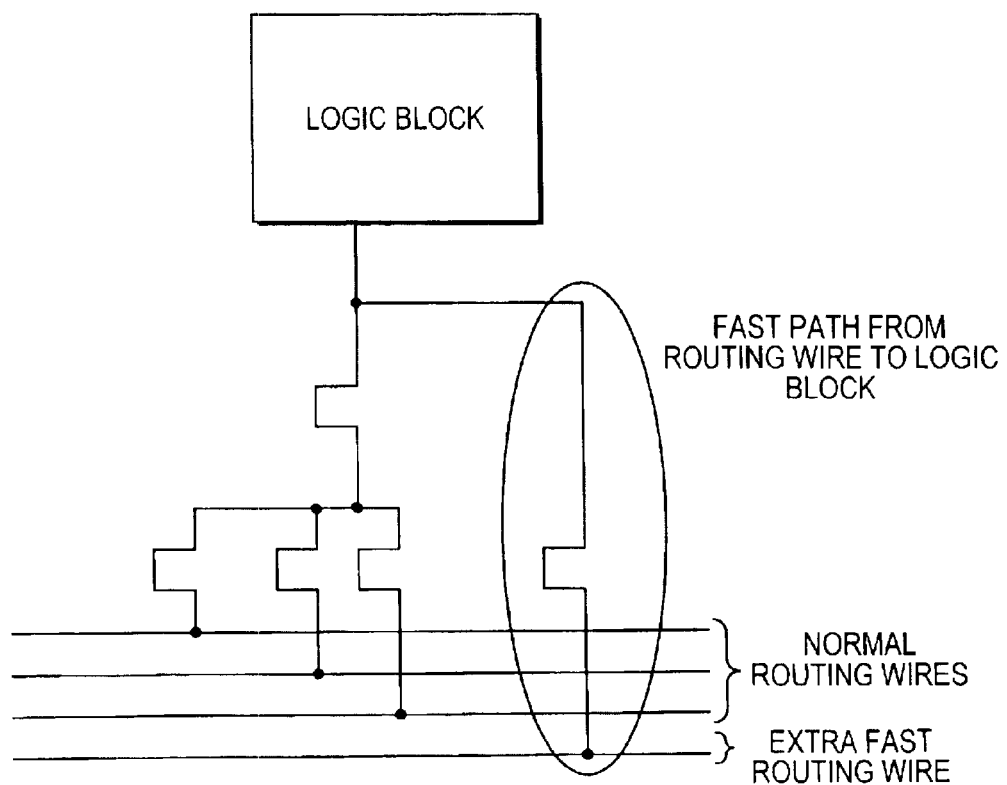
FIG. 6(b) is a schematic diagram of an unbalanced multiplexer according to the invention.

In yet another embodiment, as shown schematically in FIGS. 6(a) and (b), the interconnect resources include a plurality of routing wires which have extra-fast paths into logic blocks or I/O blocks. This can be achieved by having multiplexers between routing wires and logic or I/O block input pins with an unbalanced tree topology. The extra-fast wires connect to multiplexer inputs that go through fewer stages of multiplexing than do the regular wires. The net result is that some fraction of the wires have an extra-fast path to the logic block input pins. Only a fraction of the routing wires can use this extra-fast path to the function block input pins, however—it is simply not possible to make more than a fraction (which is always less than ½) of the inputs to a multiplexer extra-fast by unbalancing the tree (see FIG. 5).

Figure 7:
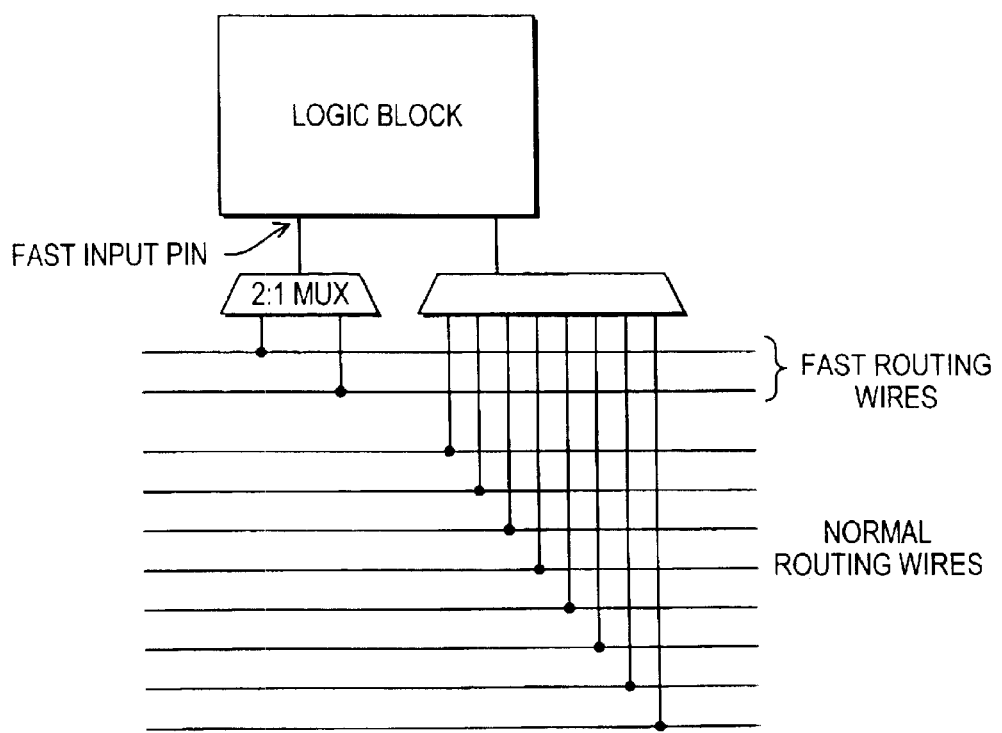
FIG. 7 is a schematic diagram showing heterogeneous inputs to a logic block.

In a further embodiment, the PLD includes groups of routing wires having extra-fast paths into logic blocks. The logic blocks have dedicated inputs for these extra-fast paths. By having these wires connect to special input pins on the logic blocks, these input pins can be driven by a smaller number of routing wires, and thus have smaller (and faster) multiplexers between them and the routing wires. The number of such extra-fast input pins is kept limited (most input pins have higher flexibility, and hence larger and slower multiplexers) in order to keep the decrease in PLD routing flexibility small, as shown in FIG. 7.

Figure 8:
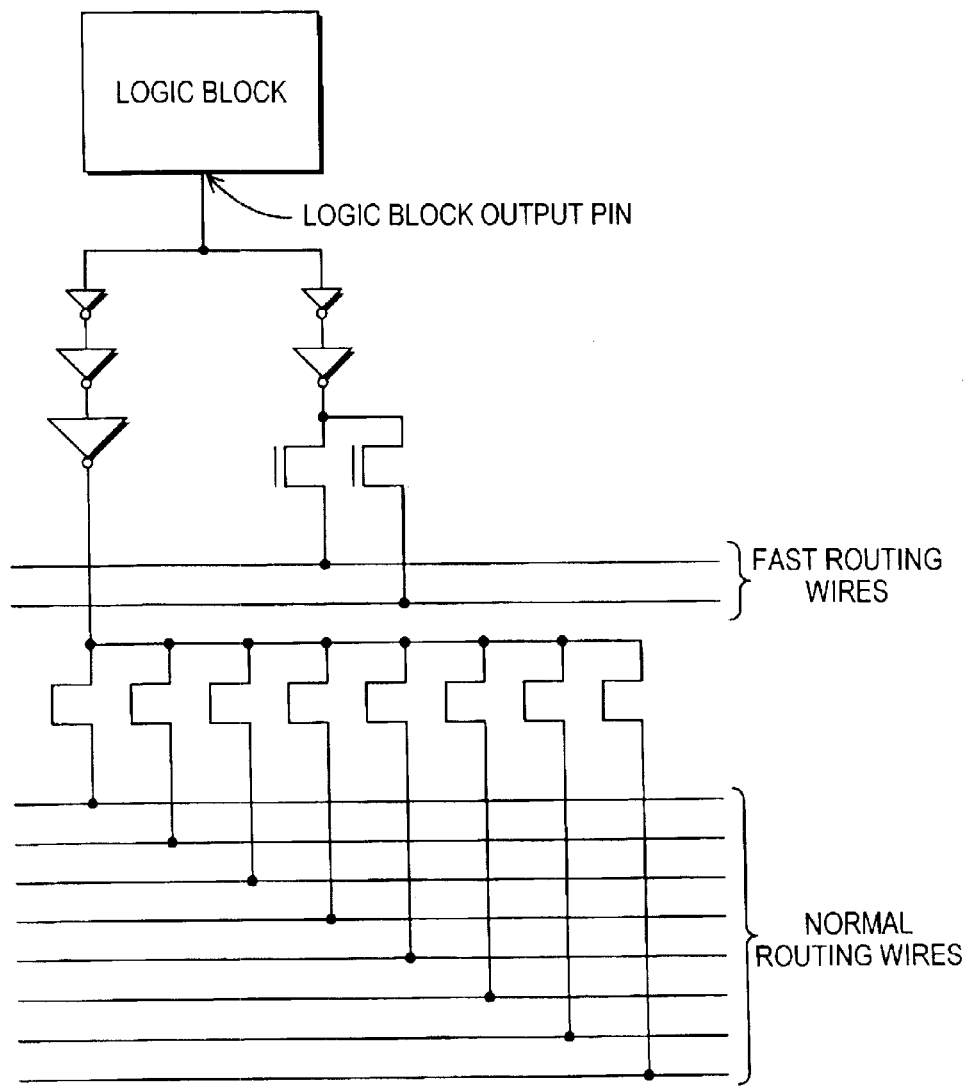
FIG. 8 is a schematic diagram of a heterogeneous interface between an output of a logic block and the routing wires.

In a still further embodiment, the PLD includes wires that can be driven by logic or I/O block output pins with extra-low delay. This can be achieved by using a separate output pin driver (buffer) with lower intrinsic delay because it has fewer stages. Because it has fewer stages, this output buffer has less drive strength than a standard output pin driver, so it is important that it drive only a subset of the wires that a logic block driver would ordinarily drive. A separate driver with more stages can be used to drive the regular routing wires to avoid a loss in routing flexibility, as shown in FIG. 8.

In a yet further embodiment, the heterogeneity can be expanded further by optimizing some wires for "glitch prevention." In this embodiment, the PLD includes a number of wires having either increased spacing between the wires or including a grounded shield wire between them or by using differential signaling for reducing unwanted transitions or glitches on the wires. For example, it is often necessary to reduce the crosstalk between adjacent wires in a PLD below some threshold in order to prevent a switching transition on one wire from causing an unwanted transition on an adjacent wire because of parasitic coupling. This unwanted transition or "glitch" can cause incorrect operation of a circuit implemented in the PLD. If only a fraction of interconnect wires are designed to be glitch free (typically by increasing the spacing between the wires or by adding a grounded shield wire between them or by using differential signaling), the PLD can offer high reliability operation without significantly increasing the area requirements. To use this feature, a CAD tool that places and routes circuits in the PLD should be smart enough to be aware of which routing wires are "glitch-free" and be able to intelligently route (either through user input or through analysis of the circuit netlist) critical signals (such as clock signals or asynchronous control signals) only on the "glitch-free" wires.

Although the invention has been described with reference to certain specific embodiments, various modifications thereof will be apparent to those skilled in the art without departing from the spirit and scope of the invention, which is limited only by the claims which follow.

We claim:

1. A programmable logic device comprising:
a plurality of function blocks;
a first plurality of a programmable interconnect resource for programmably interconnecting at least some of said function blocks; and
a second plurality of said programmable interconnect resource for programmably interconnecting some of said function blocks, said second plurality comprising about 20% of all said programmable interconnect resource on said programmable logic device.

2. The programmable logic device of claim 1 wherein said function blocks comprise logic blocks.

3. The programmable logic device of claim 1 wherein said function blocks comprise input/output circuits.

4. The programmable logic device of claim 1 wherein said first plurality of said programmable interconnect resource comprises a first group of signal wires spaced apart from each other by a first wire-to-wire spacing.

5. The programmable logic device of claim 4 wherein said second plurality of said programmable interconnect resource comprises a second group of signal wires spaced apart from each other by a second wire-to-wire spacing, said second wire-to-wire spacing greater than said first wire-to-wire spacing.

6. The programmable logic device of claim 1 wherein said first plurality of said programmable interconnect resource comprises a first type of buffer and said second plurality of said programmable interconnect resource comprises a second type of buffer, said second type of buffer having fewer stages of circuit logic than said first type of buffer.

7. The programmable logic device of claim 1 wherein said first plurality of said programmable interconnect resource comprises a balanced multiplexer and said second plurality of said programmable interconnect resource comprises an unbalanced multiplexer.

8. The programmable logic device of claim 1 wherein said second plurality of said programmable interconnect resource comprises pairs of signal wires, each said pair having a grounded signal wire between them.

9. A programmable logic device comprising:
a plurality of function blocks;
a first group of signal wires spaced apart from each other by a first wire-to-wire spacing and connected to at least some of said function blocks; and
a second group of signal wires spaced apart from each other by a second wire-to-wire spacing and connected to some of said function blocks, said second group of signal wires comprising about 20% of all said signal wires on said programmable logic device.

10. A programmable logic device comprising:
a plurality of function blocks; and
a first group of signal wires each having a first width, said first group of signal wires connected to at least some of said function blocks; and
a second group of signal wires each having a second width wider than said first width, said second group of signal wires connected to some of said function blocks and comprising about 20% of all said signal wires on said programmable logic device.

11. A programmable logic device comprising:
a plurality of function blocks; and
a plurality of programmable interconnect resources for programmably interconnecting a first one of said function blocks to a second one of said function blocks, said resources comprising:
a first group of signal wires wherein at least one wire of said first group connects said first function block to said second function block in accordance with a first operational parameter comprising signal propagation speed; and
a second group of signal wires wherein at least one wire of said second group connects said first function block to said second function block in accordance with a second operational parameter comprising circuit area.

12. The programmable logic device of claim 11 wherein each wire of said first group of signal wires has a first width and each wire of said second group of signal wires has a second width different than said first width.

13. The programmable logic device of claim 11 wherein side-by-side wires of said first group of signal wires are spaced apart from each other by a first wire-to-wire spacing and side-by-side wires of said second group of signal wires are spaced apart from each other by a second wire-to-wire spacing different than said first wire-to-wire spacing.

14. A programmable logic device comprising:
a plurality of function blocks; and
a plurality of programmable interconnect resources for programmably interconnecting said function blocks, said resources comprising:
a first group of signal wires wherein said signal wires are spaced apart from each other by a first wire-to-wire spacing; and
a second group of signal wires wherein said signal wires of said second group are spaced apart from each other by a larger second wire-to-wire spacing; wherein:
signal wires of said first group are connected to a first subplurality of said function blocks in accordance with a first operational parameter comprising circuit area; and
signal wires of said second group are connected to a second subplurality of said function blocks in accordance with a second operational parameter comprising reliability, said reliability including a degree of freedom from signal transition glitches caused by crosstalk.

15. The programmable logic device of claim 14 wherein some function blocks belong to both said first and second subpluralities of function blocks.

16. A programmable logic device comprising:

a plurality of function blocks; and a plurality of programmable interconnect resources for programmably interconnecting said function blocks, said resources comprising a first group of signal wires and a second group of signal wires wherein a pair of said signal wires from said second group has a grounded signal wire running parallel between them to at least substantially electrically shield each said wire of said pair; wherein:

signal wires of said first group are connected to a first subplurality of said function blocks in accordance with a first operational parameter selected from the group consisting of circuit area, propagation speed, and signal routing flexibility; and signal wires of said second group are connected to a second subplurality of said function blocks in accordance with a second operational parameter comprising reliability.

17. The programmable logic device of claim 16 wherein said reliability comprises a degree of freedom from signal transition glitches caused by crosstalk.

18. The programmable logic device of claim 16 wherein some function blocks belong to both said first and second subpluralities of function blocks.

* * * * *